(12) United States Patent
Degrenne (10) Patent No.: US 11,927,619 B2
(45) Date of Patent: Mar. 12, 2024

(54) POWER SEMI-CONDUCTOR MODULE, MASK, MEASUREMENT METHOD, COMPUTER SOFTWARE, AND RECORDING MEDIUM

(71) Applicant: MITSUBISHI ELECTRIC CORPORATION, Tokyo (JP)

(72) Inventor: Nicolas Degrenne, Rennes (FR)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 569 days.

(21) Appl. No.: 17/059,857

(22) PCT Filed: Jun. 4, 2019

(86) PCT No.: PCT/JP2019/022841
§ 371 (c)(1),
(2) Date: Nov. 30, 2020

(87) PCT Pub. No.: WO2020/017185
PCT Pub. Date: Jan. 23, 2020

(65) Prior Publication Data
US 2021/0223307 A1  Jul. 22, 2021

(30) Foreign Application Priority Data
Jul. 19, 2018  (EP) .................................... 18305988

(51) Int. Cl.
*H01L 27/06* (2006.01)
*G01R 31/26* (2020.01)
(Continued)

(52) U.S. Cl.
CPC ..... *G01R 31/2644* (2013.01); *G01R 31/2642* (2013.01); *H01L 23/34* (2013.01);
(Continued)

(58) Field of Classification Search
CPC ............ H01L 29/7825; H01L 29/7826; H01L 29/7803
See application file for complete search history.

(56) References Cited

U.S. PATENT DOCUMENTS 10,186,508 B2 *  1/2019  Ahlers ............... H01L 29/7803
2003/0047777 A1  3/2003  In't Zandt et al.
(Continued)

FOREIGN PATENT DOCUMENTS

JP      2005-503022 A     1/2005

OTHER PUBLICATIONS

Japanese Office Action dated Mar. 1, 2022 issued in counterpart Japanese Application No. 2021-517158 with an English Translation.

*Primary Examiner* — Lam S Nguyen
(74) *Attorney, Agent, or Firm* — Birch, Stewart, Kolasch & Birch, LLP (57) ABSTRACT

Power semi-conductor module (1) comprising: —at least one IGBT with a Gate G forming a first electrode (11) and an Emitter E forming a second electrode (12), or —at least one MOSFET with a Gate G forming a first electrode (11) and a Source S forming a second electrode (12). The first electrode (11) includes a polysilicon material made in one piece. The one-piece is made partly of a monitoring portion (13). The monitoring portion (13) is in electrical contact with the second electrode (12) such that a leakage current flows between the first electrode (11) and the second electrode (12) in an operational state of the module (1). The monitoring portion (13) has a location, a form, a size and a material composition selected together such that to have a variable resistance in function of its temperature during the operational state of the module (1).

12 Claims, 10 Drawing Sheets

(51) Int. Cl.
*H01L 23/34* (2006.01)
*H01L 29/739* (2006.01)
*H01L 29/78* (2006.01)
*G01R 31/27* (2006.01)

(52) U.S. Cl.
CPC ...... *H01L 29/7397* (2013.01); *H01L 29/7803* (2013.01); *H01L 29/7813* (2013.01); *G01R 31/275* (2013.01)

(56) References Cited

U.S. PATENT DOCUMENTS

| | | | | |
|---|---|---|---|---|
| 2005/0194635 | A1* | 9/2005 | Pfirsch | H03K 17/0822 257/329 |
| 2010/0001785 | A1* | 1/2010 | Baginski | H01L 23/34 257/E21.531 |
| 2013/0069064 | A1* | 3/2013 | Yoshihira | H01L 29/7803 257/E27.016 |
| 2016/0163689 | A1* | 6/2016 | Laven | H01C 7/006 257/334 |

* cited by examiner

POWER SEMI-CONDUCTOR MODULE, MASK, MEASUREMENT METHOD, COMPUTER SOFTWARE, AND RECORDING MEDIUM

TECHNICAL FIELD

The invention pertains to the technical field of power semiconductor devices. More specifically, the invention is related to the monitoring of such devices.

BACKGROUND ART

Monitoring temperatures in power semi-conductor devices, like Insulated Gate Bipolar Transistors (IGBTs) and Metal-Oxide-Semiconductor Field-Effect Transistors (MOSFETs) is an important function. For example, it is useful for protection, condition and health monitoring. It is known to add specific sensors as close as possible to the die, the die being generally the most important and the hottest part of such devices. The temperature can be measured directly by using temperature sensors, or indirectly by using other sensors.

Generally, the free surface of a die is very small. To fix a sensor on it is difficult, and even impossible in some cases. To circumvent this problem, it is usual to dispose the sensor at a distance from the die and to use mathematical function to correct and deduce the temperature of the die itself in function of a measured or deduced temperature next to the die. This is inaccurate.

In addition, to use such sensors implies to add additional equipment, additional connections and additional process stages to obtain the semiconductor devices. The cost is high.

SUMMARY OF INVENTION

The invention improves the situation.

It is proposed a power semi-conductor module comprising:
- at least one Insulated Gate Bipolar Transistor IGBT with a Gate G forming a first electrode and an Emitter E forming a second electrode, or
- at least one Metal-Oxide-Semiconductor Field-Effect Transistor MOSFET with a Gate G forming a first electrode and a Source S forming a second electrode.

The first electrode includes a polysilicon material made in one piece The one-piece is made partly of a monitoring portion. The monitoring portion is in electrical contact with the second electrode such that a leakage current flows between the first electrode and the second electrode in an operational state of the module. The monitoring portion has a location, a form, a size and a material composition selected together such that to have a variable resistance in function of its temperature during said operational state of said module.

In another aspect, it is proposed a mask for a polysilicon deposition operation during fabrication of a module as described in the present document. The mask is configured such that the polysilicon material forming the first electrode and the monitoring portion is deposited during a single deposition operation and in one piece.

In another aspect, it is proposed a measurement method for estimating a temperature of a power semi-conductor module as described in the present document. The method comprises:
a) trigger a measurement when no current is provided from the Emitter E of the Insulated Gate Bipolar Transistor IGBT, respectively from the Source S of the Metal-Oxide-Semiconductor Field-Effect Transistor MOSFET;
b) generate a diagnostic mode of the first electrode of the module during which a resistance is positioned in a closed electrical network including the first electrode, the second electrode, and a voltage source of a gate driver;
c) monitor at least a voltage or a current on said loop;
d) convert the monitored values into temperatures according to calibration data.

In another aspect, it is proposed a computer software comprising instructions to implement at least a part of a method as defined here when the software is executed by a processor. In another aspect, it is proposed a computer-readable non-transient recording medium on which a software is registered to implement the method as defined here when the software is executed by a processor.

The following features, can be optionally implemented, separately or in combination one with the others:

The monitoring portion has a material composition and a useful cross-section selected together such that:
- a resistance value R of the monitoring portion has a value between 10 kΩ and 1 MΩ for the expected operating temperatures range of the module; and/or
- a resistance value R of the monitoring portion has a variation of at least a factor of 2% within the expected operating temperatures range of the module (1).

The monitoring portion comprises at least one of the following:
- a passage arranged through an oxide layer lining a wall of a trench of the first electrode;
- a polysilicon layer covering continuously at least a trench of the first electrode and a dummy trench of the second electrode;
- an extension part disposed between a polysilicon material element of the first electrode and a polysilicon material element of the second electrode in such a way to ensure an electric link between said two electrodes.

The module further comprises a measurement circuitry electrically connected between the first electrode and the second electrode.

The measurement circuitry includes:
- at least one Analog-to-Digital Converter;
- a resistance having a resistance value Rm, Rm being equal to α×R, where R is the resistance of the monitoring portion and α is a factor comprised between 0.1 and 10; and
- a set of switches arranged such that to connect and disconnect the resistance from a closed electrical network including the first electrode, the second electrode, and the a voltage source of the a gate driver.

The measurement method for estimating a state of health of a connection of a power semi-conductor module comprises:
1) trigger a measurement when a high current is crossing a connection of the Emitter E of the Insulated Gate Bipolar Transistor IGBT, respectively from the Source S of the Metal-Oxide-Semiconductor Field-Effect Transistor MOSFET;
2) generate a diagnostic mode of the first electrode of the module during which said first electrode is electrically disconnected;
3) monitor at least a voltage;
4) convert the monitored values into a damage index according to calibration data.

The invention and its various embodiments enable to propose semiconductor devices with an embedded temperature sensor. In the most cases, the supplementary area occupied by the monitoring element on the MOSFET/IGBT is zero or almost zero. The proposed technical solution is easily adaptable and compatible with the most part of the existing architectures of semiconductor devices. Few modifications on the existing masks used to create semiconductors are sufficient to obtain semiconductors with integrated thermal sensors.

Other features, details and advantages will be shown in the following detailed description and on the figures.

DESCRIPTION OF EMBODIMENTS

Figures and the following detailed description contain, essentially, some exact elements. They can be used to enhance understanding the invention and, also, to define the invention if necessary.

Figure 1:
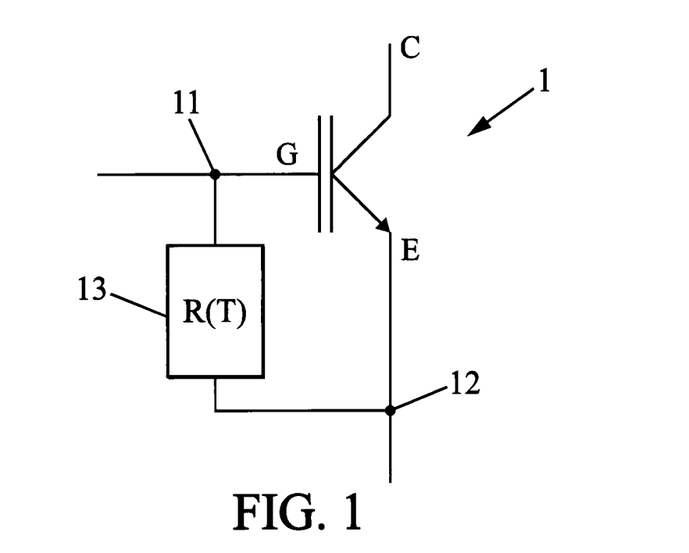
FIG. 1 is an electrical diagram according to an embodiment of the invention.
Figure 2:
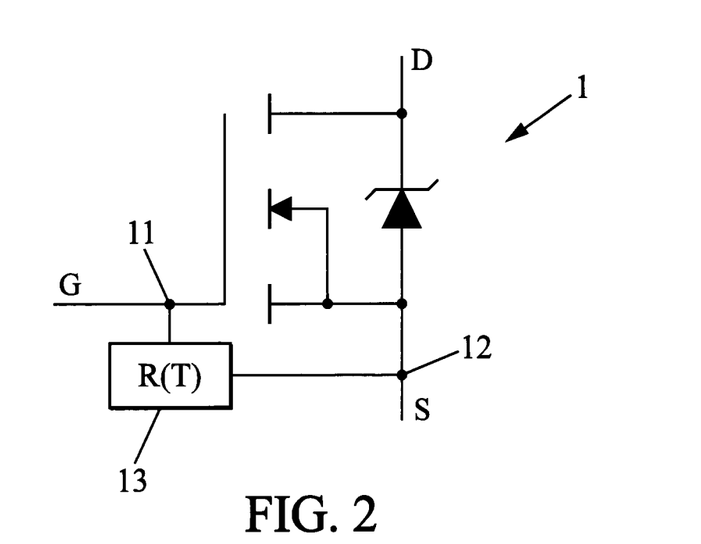
FIG. 2 is an electrical diagram according to an embodiment of the invention.

It is now referred to FIG. 1 and FIG. 2. Each of these figures shows a Power semi-conductor module 1. On FIG. 1, the module 1 comprises an IGBT with a Gate (G) forming a first electrode 11 and an Emitter (E) forming a second electrode 12. On FIG. 2, the module 1 comprises a MOSFET with a Gate (G) forming the first electrode 11 and a Source (S) forming the second electrode 12. In the following, the words "first electrode 11" and "second electrode 12" are used to designate the electrodes for each ones of the two types of semiconductors (IGBT and MOSFET). In others words, a person skilled in the art would understand that the following described features and embodiments can be applied to anyone of such semiconductor components, whatever there type (IGBT or MOSFET).

The module 1 comprises a monitoring portion 13. The monitoring portion 13 is electrically disposed between the first electrode 11 and the second electrode 12. As it will be described in the following, during an operational state of the module 1, the monitoring portion 13 will have the behavior of a temperature-sensitive resistor (or "thermistor"). The monitoring portion 13 is disposed in parallel with the gate-emitter active connection of the IGBT, respectively in parallel with the gate-source active connection of the MOSFET, such that a leakage current flows through the monitoring portion 13 in a steady-state when a gate-emitter voltage, respectively a gate-source voltage, is applied.

Figure 3:
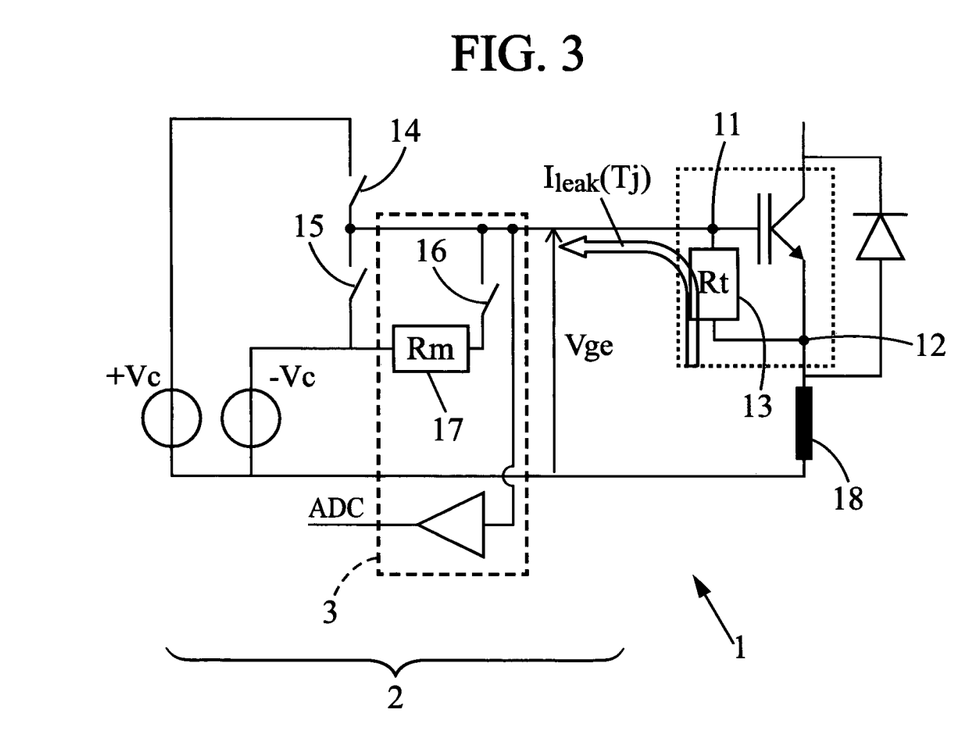
FIG. 3 is an electrical diagram according to an embodiment of the invention.
Figure 4:
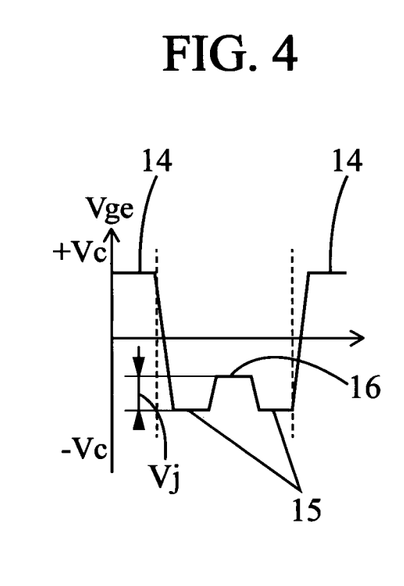
FIG. 4 represents an evolution of a voltage during time related to the diagram of FIG. 3.

It is now referred to FIG. 3 and FIG. 4. In the shown embodiment, an anti-parallel diode is connected between the Collector (C) and the Emitter (E) of the IGBT. The module 1 further comprises a measurement circuitry 2 electrically connected between the first electrode 11 and the second electrode 12, and in parallel with the monitoring portion 13. The monitoring portion 13 as the effect of:
creating a temperature-sensitive current between the first electrode 11 and the second electrode 12 when a strictly positive or strictly negative voltage is applied between the two electrodes 11, 12;
creating a temperature-sensitive voltage between the first electrode 11 and the second electrode 12 when a strictly positive or strictly negative current is applied between the two electrodes 11, 12.

Thus the effect of the temperature can be measured on the side of the first electrode 11 (gate side) by monitoring a current $I_{meas}$ or a voltage $V_{meas}$.

On FIG. 3, the measurement circuitry 2 comprises:
two voltage generators referenced $+V_e$ and $-V_c$ (for example +15V and −15V),
two switches 14, 15 arranged to alternatively connect the two voltage generators $+V_c$ and $-V_c$ in the closed electrical network composed of the first electrode 11, the monitoring portion 13, and the second electrode 12, and
a sensor part 3 including an output in the form of an ADC (ADC for "Analog-to-Digital Converter"), and a switch 16 in series with a resistance 17. In the examples, the resistance value Rm of the resistance 17 is of the same order of magnitude as the resistance R of the monitoring portion 13. For example, Rm=α×R, where the factor α is comprised between 0.1 and 10. Such a circuitry enables to detect and measure a leakage current $I_{leak}(Tj)$ on the first electrode 11 or a voltage $V_{ge}$ between the first electrode 11 and the second electrode 12.

On FIG. 4, the numerical references 14, 15, 16 correspond to the state for which the corresponding switch 14, 15, 16 is closed. The switches are an example of means to connect and disconnect the resistance 17 in a closed electrical network including the first electrode 11, the second electrode 12, and a voltage source of the gate driver.

In various embodiments, the measurement circuitry 2 is used to enforce measuring the voltage drop in the second electrode connection 18 when it is crossed by current flowing through the anti-parallel diode. In this case, the first electrode 11 (Gate) is kept floating. Its potential is the one of the second electrode 12 (Emitter). The potential measured between the first electrode 11 and the second electrode connection 18 is correlated to the resistance of the second electrode connection 18. This measure allows monitoring the health of the second electrode connection 18 (emitter connection), for example the wire-bonds. Such a method will be described after.

Structurally, the first electrode 11 includes a polysilicon material made in one piece. The one-piece is also made, partly, of the monitoring portion 13. The first electrode 11 and the monitoring portion 13 are made together all in one block, said block comprising a polysilicon material. The monitoring portion 13 is in electrical contact with the second electrode 12 such that a leakage current flows between the first electrode 11 and the second electrode 12, via the monitoring portion 13, in an operational state of the module 1. The monitoring portion 13 has a location, a form, a size and a material composition (polysilicon) selected together such that to have a variable resistance R in function of its temperature T during the operational state of the module 1.

In the following, the examples are detailed for a trench structure. The above and following features can also be applied to structures different from trench structures, for example planar structures (without trench).

Figure 5:
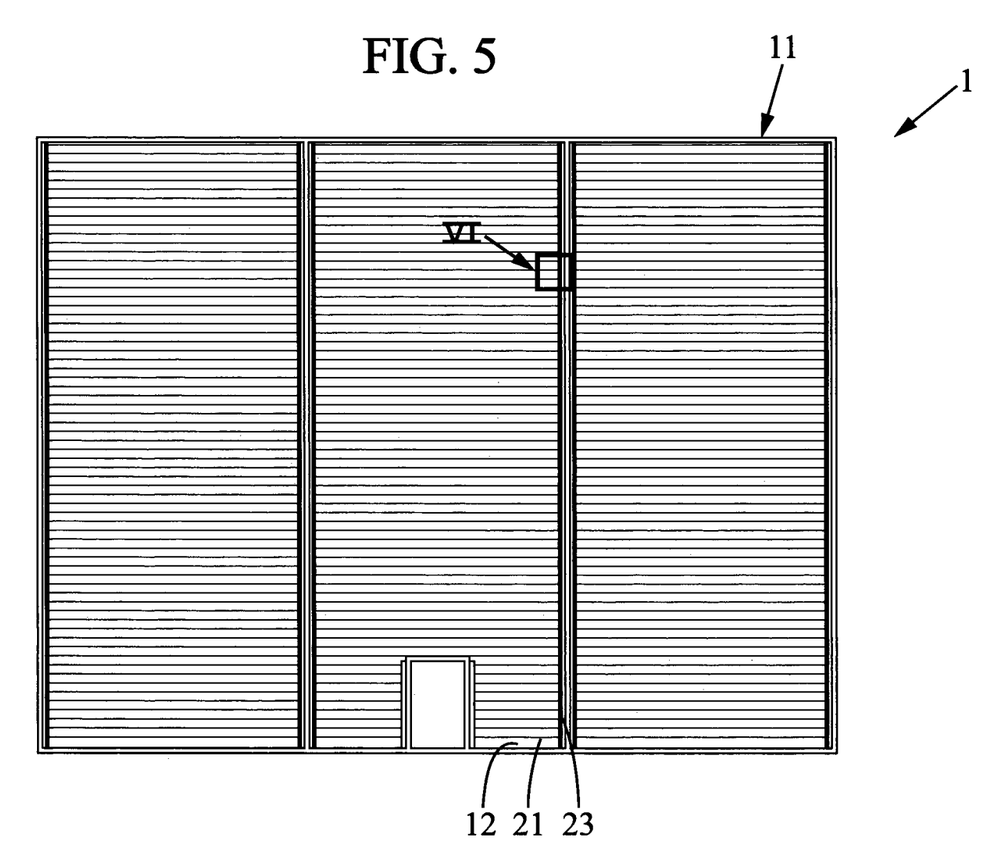
FIG. 5 is a general top view of an embodiment of a module according to the invention.

FIG. 5 shows an example of die lay-out in a trench structure. Only the top face of the module 1 can be seen on FIG. 5. The first electrode 11 (Gate) extends along the periphery of the module 1. The second electrode 12 corresponds to the top surface of the internal area on FIG. 5. Trenches 21 are formed under the top surface. Trenches 21 corresponds to horizontal, fines and dark lines on FIG. 5. Tranches 21 are substantially rectilinear and parallel one with respect to the others, in the horizontal direction of FIG. 5. An electrical insulator 23 is provided between periphery (first electrode 11) and the top surface of the internal area (second electrode 12). On FIG. 5, the electrical insulator 23 corresponds to vertical lines extending along the first electrode 11 lines, at each end of the trenches 21. The electrical insulator 23 can be obtained by a local absence of electrical conductive material, for example by local absence of a top conductive layer.

Figure 6:
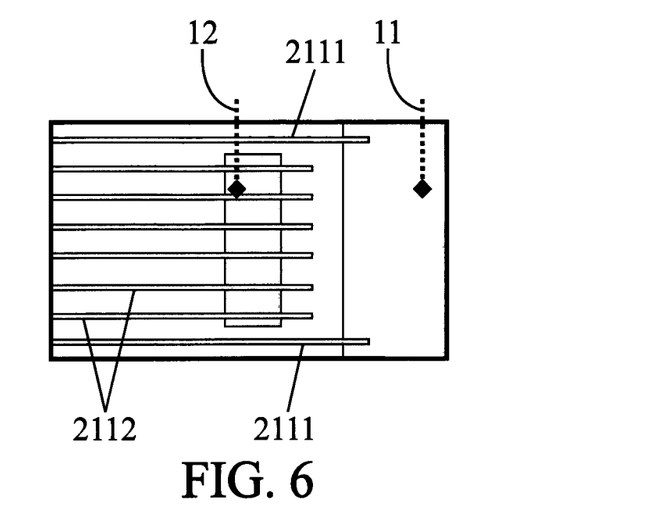
FIG. 6 is a top view of a detail of FIG. 5.

It is now referred to FIG. 6. FIG. 6 shows a detail referred VI on FIG. 5. It is possible to distinguish two types of trenches 21: first electrode trenches 2111 (or Gate trenches) and dummy trenches 2112 (corresponding to second electrode trenches). First electrode trenches 2111 extends until the periphery (first electrode 11; the Gate line) while the dummy trenches 2112 are interrupted at distance from the periphery. In the following examples and in the part VI, the dummy trenches 2112 are electrically connected to the second electrode 12. In the rest of the module 1, some of the trenches can be inactive and neither connected to the first electrode 11, nor to the second electrode 12. The module 1 can comprise more trenches 21 than the number strictly necessary to conduct electricity. For example, in some embodiments, to let un-connected trenches (free trenches) allows to reduce the electrical field in a device.

In an electric point of view, the first electrode 11 (Gate) can be decomposed into three portions of the module 1 which are electrically interconnected and wherein a first electrode potential is present:

the first electrode pad (gate pad) is connected through the line (gate line) to the first electrode trenches 2111 (gate trenches). For example, the pad is connected to elements distinct from the module 1 via at least one wire-bond. For example, the pad is made in aluminum;
the first electrode line or layer (gate line or gate layer) distributes the first electrode potential (gate potential) in the active areas of the module 1. For example, the gate line is made in aluminum and/or polysilicon;
the first electrode trenches 2111 (gate trenches) which correspond to the active areas of the module 1, for example filled with polysilicon.

In an electric point of view, the second electrode 12 (Emitter/Collector) can be decomposed into five portions of the module 1 which are electrically interconnected and wherein a second electrode potential is present:

the second electrode pad (emitter/collector pad) is connected through plugs to N+ doping regions of the silicon, and to the dummy trenches 2112. For example, the pad is connected to elements distinct from the module 1 via at least one wire-bond. For example, the pad is made in aluminum;
second electrode plugs (emitter/collector plugs) form vertical connections connecting the second electrode pad to a second electrode line and/or N+ doping regions and/or dummy trenches 2112. For example, the second electrode plugs are made in tungsten;
the second electrode line or layer (emitter/collector line) forms for example a non-active polysilicon layer;
N+ doping regions corresponding to active areas of the semi-conductor material;
the second electrode trenches 2112 (emitter/collector trenches) not directly connected to the gate potential but to the emitter/collector potential. For example, the dummy trenches 2112 are filled with polysilicon.

In the following embodiments, a thermistor is created between one of the three first electrode portions and one of the five second electrode portions. For example, the polysilicon pattern is locally adapted to create the thermistor.

Figure 7:
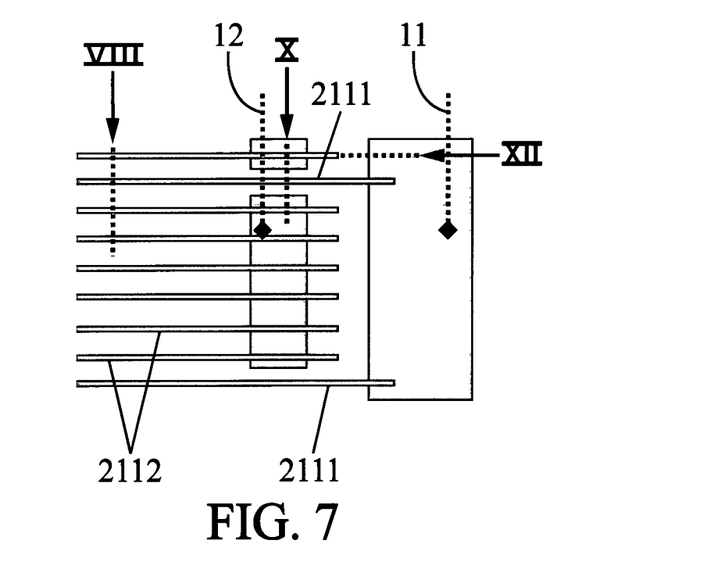
FIG. 7 is a view similar to FIG. 6 on which the locations of the sectional views of following figures are represented.

It is now referred to FIG. 7. FIG. 7 is similar to FIG. 6, wherein three distinct cutting planes are represented, each corresponding to one of the detailed embodiments. The cutting plane having the reference VIII corresponds to the plan of FIG. 8 and FIG. 9. The cutting plane having the reference X corresponds to the plan of FIG. 10 and FIG. 11. The cutting plane having the reference XII corresponds to the plan of FIG. 12 and FIG. 13. The positions of the three cutting planes are represented on the same FIG. 7 in order to help to understand and compare embodiments. Even if the three cutting planes are represented on the same FIG. 7, the three embodiments are independent one from the others and are not necessarily combined in a same module 1.

Figure 8:
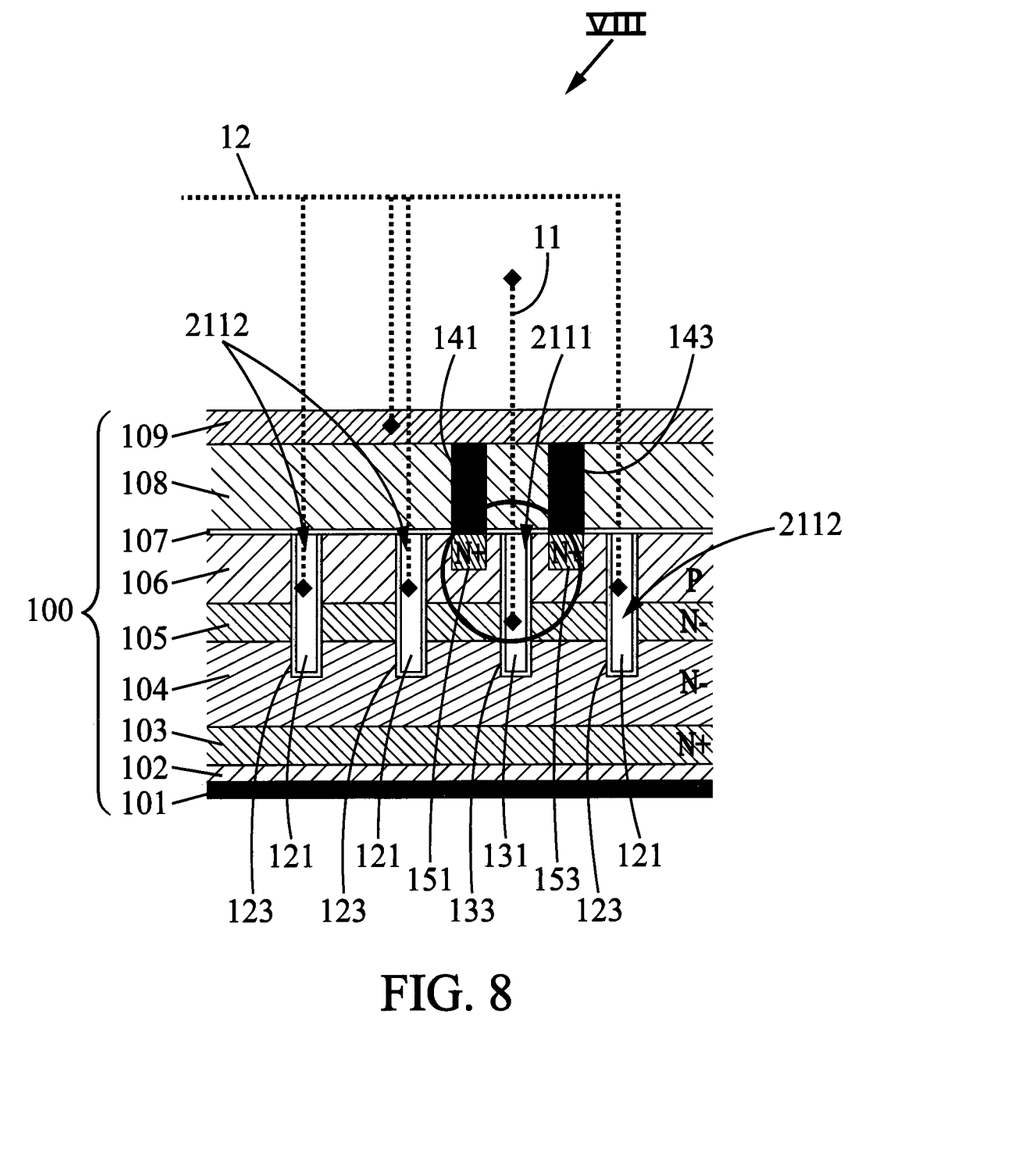
FIG. 8 is a sectional view of a semiconductor module.

In each one of the embodiments shown on FIG. 8 to FIG. 13, the module 1 comprises a superposition 100 of a plurality of layers. On FIG. 8, for example, the superposition 100 comprises the following layers, from the bottom to the top:

a finish layer 101 (or "support layer");
a first P doped layer 102;
a $N^+$ doped layer 103 (or "buffer layer");
a first $N^-$ doped layer 104 (or "semiconductor base layer");
a second $N^-$ doped layer 105 (or "carrier storage layer");
a second P doped layer 106;
an oxide layer 107;
a BPSG layer 108 (a silicate glass; BPSG for "Borophosphosilicate glass");
a metal layer 109 (for example aluminum).

Figure 9:
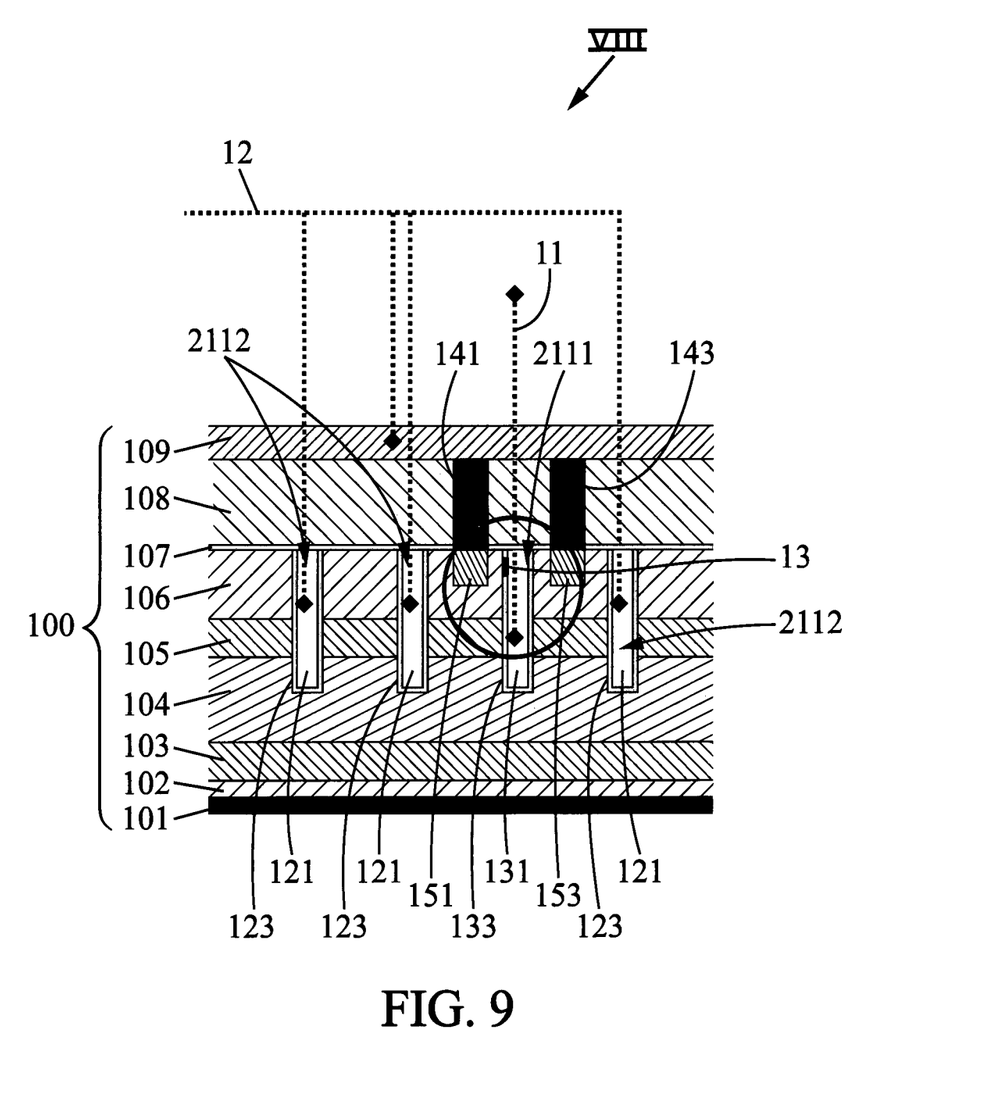
FIG. 9 is a sectional view corresponding to one embodiment of the invention.

It is now referred to FIG. 8 and FIG. 9. In such a first embodiment, the thermistor is formed by creating a polysilicon link between at least a first electrode trench 2111 and an N+ doping region corresponding to an active area of the semi-conductor material. As it can be seen on FIG. 8, the internal wall of each one of the three dummy trenches 2112 is coated with an isolating film 123, an oxide similar to the oxide of the oxide layer 107 in the example. In such a way, the interior of the trench is electrically isolated from the rest of the superposition 100. Each one of the three dummy trenches 2112 are filled, inside the isolating film 123, with polysilicon filling 121. The polysilicon 121 enables to conduct electricity along the dummy trench 2112 (in the horizontal direction of FIG. 7). The first electrode trench 2111 is coated with an isolating film 133, an oxide similar to the oxide of the oxide layer 107 in the example. In such a way, the interior of the trench is electrically isolated from the rest of the superposition 100. The first electrode trench 2111 is filled, inside the isolating film 133, with polysilicon filling 131. The polysilicon 131 enables to conduct electricity along the first electrode trench 2111 (in the horizontal direction of FIG. 7). In the vertical direction, through the superposition 100, the trenches 2111, 2112 extend from the first $N^-$ doped layer 104 to the oxide layer 107.

As it can be seen on FIG. 8, the module 1 further comprises a pair of plugs disposed respectively at each side of the first electrode trench 2111. The plugs include, in the vertical direction:
- a bottom portion 151, respectively 153, extending from the second P doped layer 106 to the oxide layer 107; and
- a top portion 141, 143, continuous with the respective bottom portion, extending from the oxide layer 107 to the metal layer 109.

The bottom portions 151, 153 are doped and electrically in contact with the second electrode 12 via the top portions 141, 143.

A comparison of FIG. 8 and FIG. 9 enables to understand how a monitoring portion 13 (a thermistor) can be obtained, made in one-piece with the first electrode 11 (the polysilicon filling 131) and including a polysilicon material. The monitoring portion 13 is in electrical contact with the second electrode 12, via the bottom portions 151, 153, the top portions 141, 143, and the metal layer 109. In an operational state of the module 1, a leakage current flows between the first electrode 11 and the second electrode 12.

In the first embodiment, the monitoring portion 13 is obtained by maintaining a local gap in the isolating film 133 of the first electrode trench 2111 when the said film is formed. In the context, "gap" has to be understand as a voluntarily lack of film, or a hole in the film, in a specific location such as to form a hollow part, or a "window", in the film. The oxidation step to form the isolating film 133 is, for example, a thermal oxidation which is not selective. In order to create the gap, the desired area is, for example, previously covered with a film of silicon nitride. The film of silicon nitride blocks the diffusion of oxygen and water vapor due to its oxidation at a much slower rate. Then, the film of silicon nitride is removed after oxidation is complete.

Then, when the first electrode trench 2111 is filled with polysilicon filling 131, the gap is also filled: the polysilicon filling 131 and the monitoring portion 13 are made in one piece. In the example, the polysilicon filling 131 and the monitoring portion 13 are made in a single step.

The local gap in the gate oxide, replaced by the monitoring portion 13 made in polysilicon allows making an electrical connection from the polysilicon filling 131 in the first electrode trench 2111 at Gate potential to the $N^+$ doped region of the bottom portion 151 connected to the second electrode 12 (at Emitter/Collector potential). The location, the form and the size of the gap (and of the resulting monitoring portion 13) are selected together to set the thermistance. The thermistance defines the resistance behavior of an electrical component in function of temperature, which can be NTC or PTC ("Negative Temperature Coefficient" or "Positive Temperature Coefficient").

In other words, the location, the form and the size of the monitoring portion 13 are selected to determine the behavior of the monitoring portion 13 such that the resistance R varies in a predetermined and controlled manner in function of the temperature T during the operational state of the module 1.

A single gap (a single monitoring portion 13) can be made. In such a case, a higher resistance value of the monitoring portion 13 is set. The location of the gap can be, for example, in the center of the module 1 where the temperature is the generally the hottest. Alternatively, the location may also be below a specific wire-bond where the temperature is the hottest.

In various embodiments, a plurality of gaps can be made. This enables to reduce the local resistance value and/or to obtain temperature monitoring of various parts in the module 1.

A manner to set up precisely the thermistance is to set the area (or useful cross-section) of the gap (other parameters being considered as fixed). In the tests made by the applicant, an area of the gap inferior to 1 $\mu m^2$ is sufficient to reach a good thermistance behavior. A person skilled in the art would adapt the other parameters (location, form, material composition) in order to have a desired thermistance in function of the specific structure of the module 1.

It is generally considered that a polysilicon have a resistivity ranging from $10^{-3}$ Ω·cm to $10^5$ Ω·cm depending on the doping concentration. In order to have a good monitoring of the temperature, the applicant determined that the thermistance should be preferably set up such that the resistance value R has a value between 10 kΩ (minimum value defined by losses in the device) and 1 MΩ (maximum value defined by the sensitivity of measurement circuit and equivalent resistance of gate oxide) for the expected operating temperatures range of the module 1. In the context, the "the expected operating temperatures range of the module 1" corresponds to the temperatures range especially planned by the manufacturer of the module 1. Such ranges are indicated in the technical documentation which is necessarily provided with any semiconductor module. For example, the temperature range of the modules 1 on which the applicant made tests is 25° C. to 125° C. The applicant also determined that the thermistance should be preferably set up such that the resistance value R has a variation of at least a factor of 2% within the expected operating temperatures range of the module 1 (for example between 25° C. and 125° C.).

Such behaviors of the monitoring portion 13 can be obtained with usual polysilicon materials used in the power semi-conductor devices field. In various embodiments, specific doping properties of the polysilicon constituting the monitoring portion 13 can be used. Such doping properties can be specific to the monitoring portion 13 and different from the rest of the polysilicon filling 131 (by local doping) or can be homogeneous in the one-piece polysilicon. In other words, even if the polysilicon is made in one piece, the chemical composition is not necessarily homogeneous.

Figure 10:
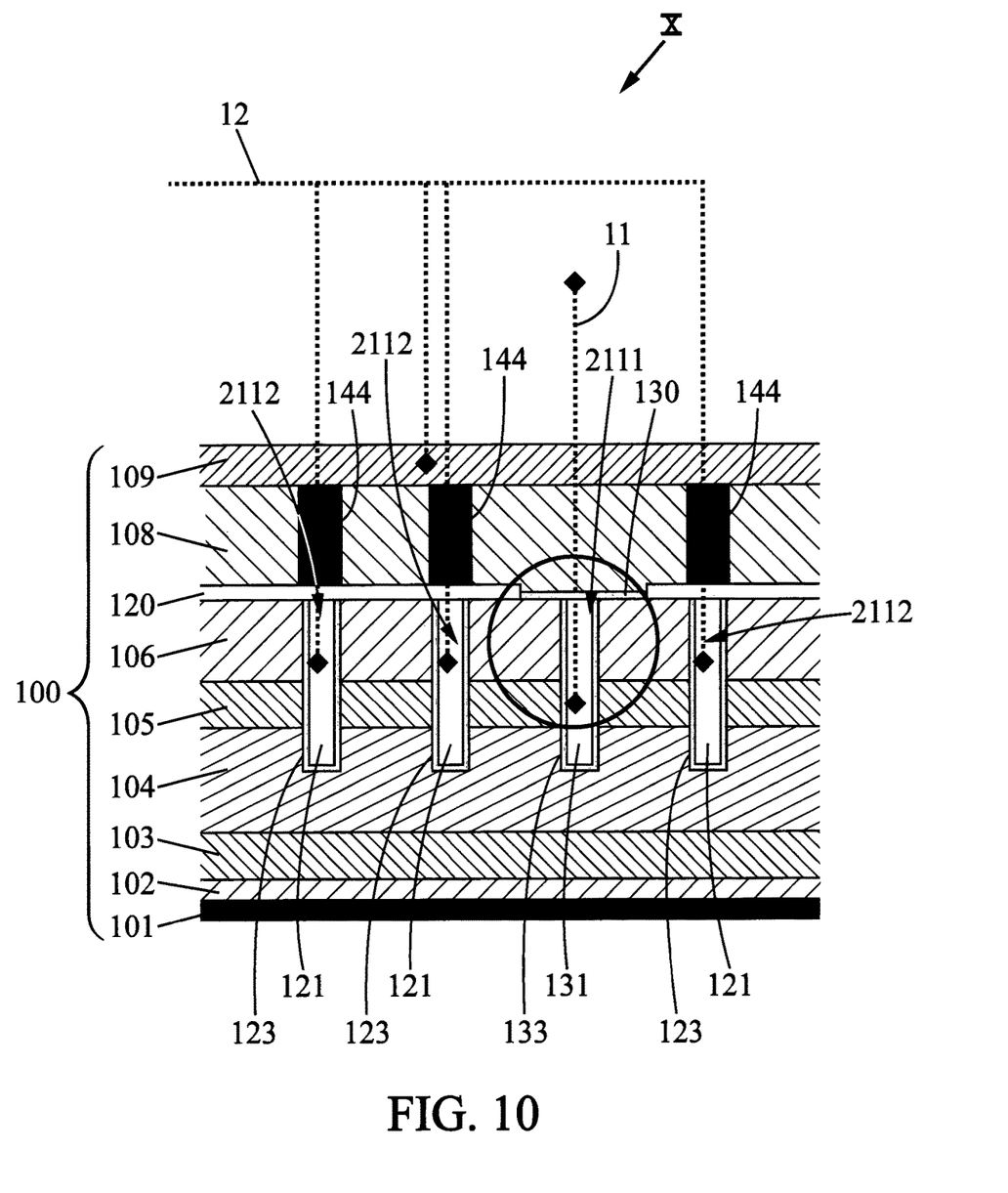
FIG. 10 is a sectional view of a semiconductor module.
Figure 11:
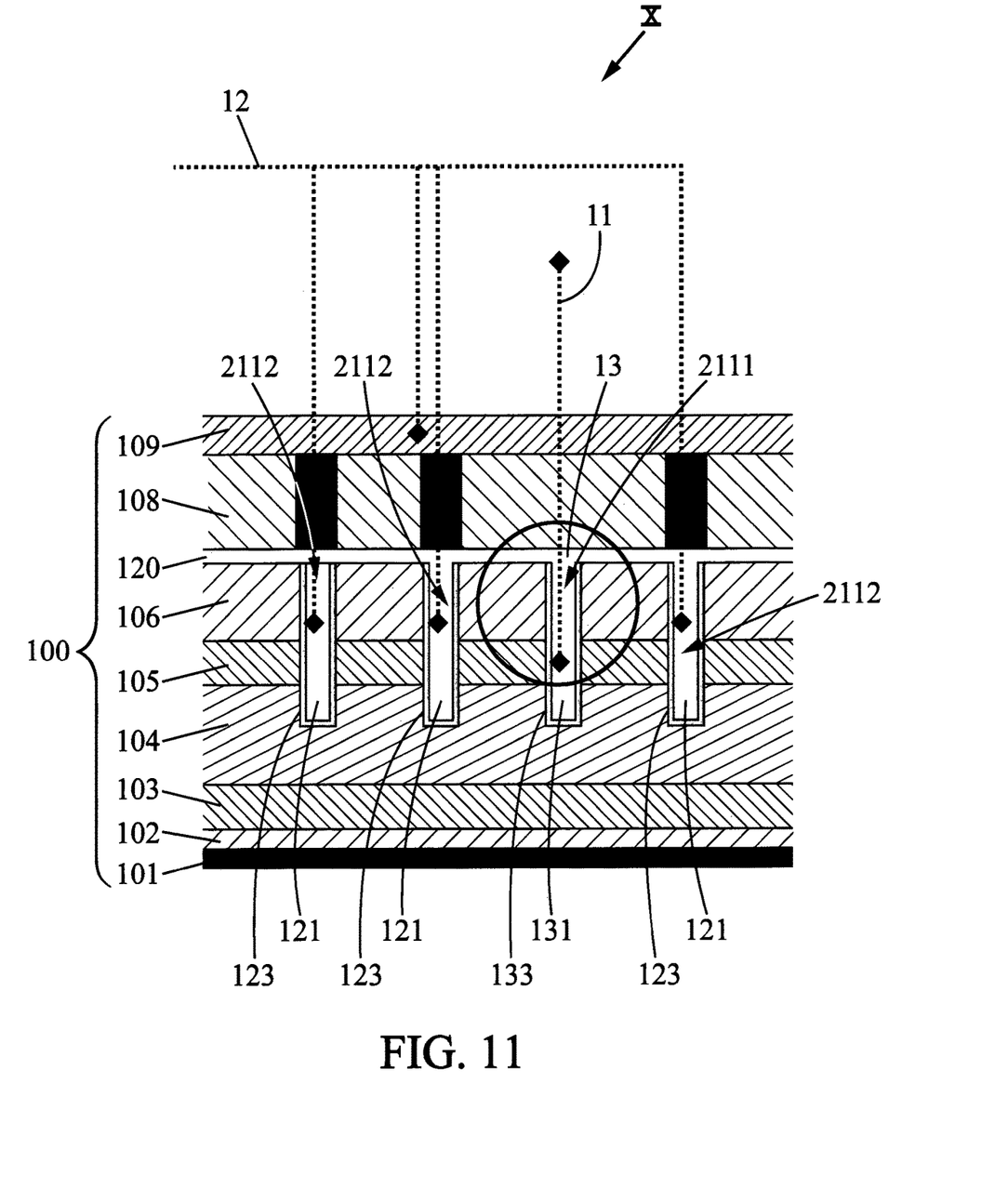
FIG. 11 is a sectional view corresponding to one embodiment of the invention.

It is now referred to FIG. 10 and FIG. 11. In such a second embodiment, the thermistor is formed by creating a polysilicon link between at least a dummy trench 2112 and a first electrode trench 2111. The second embodiment is easier to implement than the first embodiment.

On FIG. 10 and FIG. 11, elements similar to these of the preceding figures have the same numerical references. By comparison to the first embodiment (FIG. 8 and FIG. 9), the plugs are absent. Plugs 144 are provided on top of the dummy trenches 2112 through the BPSG layer 108. The most part of the oxide layer 107 of the superposition 100 is replaced by a polysilicon layer 120 on top of the dummy trenches 2112. The polysilicon layer 120 covers at least the top of the dummy trenches 2112.

Usually, and as it is represented on FIG. 10, the electric isolation between the polysilicon filling 121 in the dummy trenches 2112 and the polysilicon filling 131 in the first electrode trench 2111 is ensured by a portion 130 of the oxide layer 107 which is preserved on top of the first electrode trench 2111. In the example of FIG. 11, the portion 130 of the oxide layer 107 is absent. Instead of that, the polysilicon layer 120 is made in one piece with the polysilicon filling 121 in the dummy trenches 2112 and with the polysilicon filling 131 in the first electrode trench 2111. In other words, the polysilicon layer 120 extends on the trenches, including on top of the first electrode trench 2111. The part of the polysilicon layer 120 extending on top of the first electrode trench 2111 forms the monitoring portion 13 of the second embodiment. The monitoring portion 13 creates the wanted resistive path between the first electrode 11 and the second electrode 12. In the second embodiment, the size, and especially the thickness, of the monitoring portion 13 is defined to generate the required thermistance behavior.

The plugging of the concerned dummy trench may be locally removed such that the contact with the emitter is performed on the other side (the opposite end) of the dummy trench. In such a way, the resistance of the dummy trench itself is added to the thermistance. Several adjacent dummy trenches may be endwise connected, for example in a serpentine structure. In such a way, the resistance of the dummy trenches are cumulated and added to the thermistance. By judiciously removing dummy plugs and modifying the polysilicon layer connecting the dummy trenches together, it is possible to adapt, at will, the value of the thermistance.

To provide the polysilicon elements (polysilicon filling 121, polysilicon filling 131, the polysilicon layer 120 and its monitoring portion 13), known process can be used. For example, the polysilicon is deposited by Low-Pressure Chemical Vapor Deposition (LPCVD), lithography (resin coating, mask deposition, activation, selective resin removal) and/or dry etching (selective removal of polysilicon, removal of remaining resin). To create the monitoring portion 13, it is possible to adapt a known mask used in the lithography in order to replace the usual portion 130 of the oxide layer 107 (see FIG. 10) by the monitoring portion 13 made of a part of the polysilicon layer 120 (see FIG. 11). The exact manner to adapt the mask to obtain such a monitoring portion would be easily determined, in function of each module 1, by a person skilled in the art.

Figure 12:
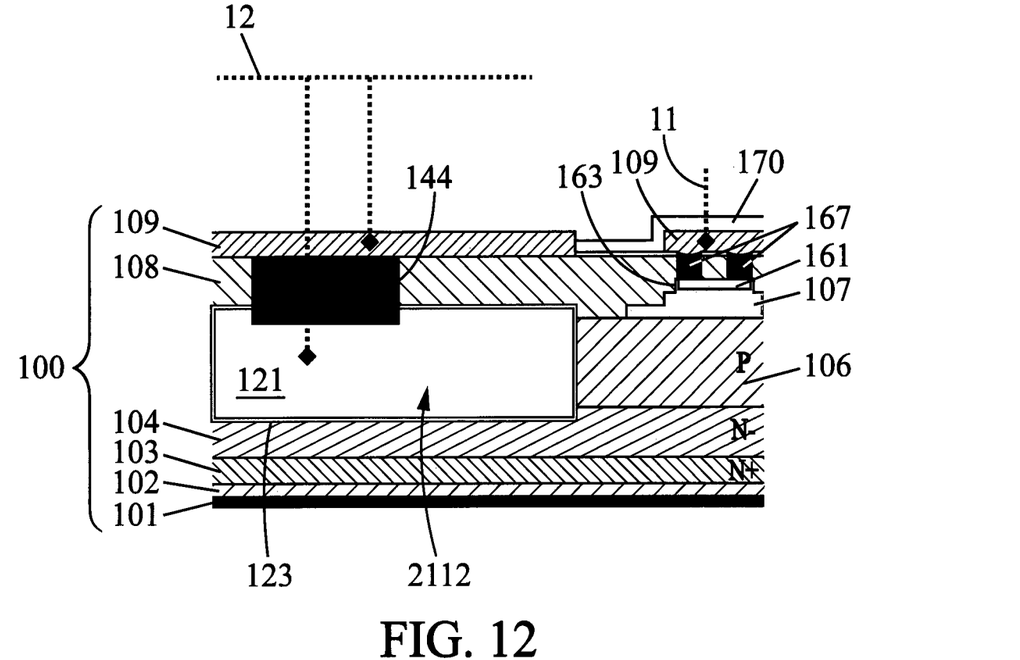
FIG. 12 is a sectional view of a semiconductor module.
Figure 13:
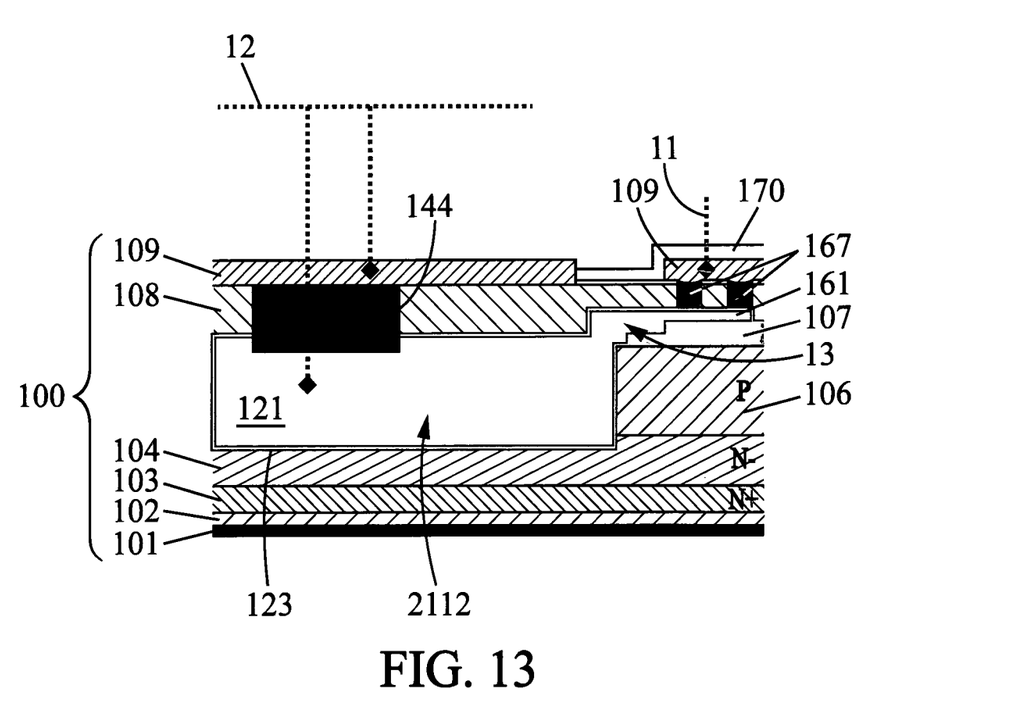
FIG. 13 is a sectional view corresponding to one embodiment of the invention.

It is now referred to FIG. 12 and FIG. 13. The plane of these figures is substantially perpendicular to the one of the preceding embodiments (see FIG. 7). Elements similar to thus of the preceding figures have the same numerical references. On the right part of the figures, it can be seen that a part of the metal layer 109 on the top of the first electrode 11 is, as it is usual, separated from a part of the metal layer 109 on the top of the second electrode 12. In the part of the first electrode 11 (Gate), the superposition 100 is different from the superposition in the part including the trenches 2111, 2112. The superposition 100 comprises the following layers, from the bottom to the top:

the finish layer 101 (or "support layer");
the first P doped layer 102;
the N+ doped layer 103 (or "buffer layer");
the first N doped layer 104 (or "semiconductor base layer");
the second P doped layer 106;
a thick part of the oxide layer 107;
the BPSG layer 108 (a silicate glass, BPSG for "Borophosphosilicate glass");
the metal layer 109 (for example aluminum).

In the BPSG layer 108, on the thick part of the oxide layer 107, a polysilicon layer 161 is provided. The polysilicon layer 161 extends substantially in the direction perpendicular to the plane of FIG. 12 and FIG. 13. In planes including a first electrode trench 2111 (not visible on figures), the polysilicon layer 161 is made in one piece with the polysilicon filling 131 of the trench 2111. On the polysilicon layer 161, plugs 167 are provided in order to ensure an electrical connection between the polysilicon layer 161 and the above part of the metal layer 109. A protective layer 170, for example in polyamide, is added on the top.

In such a third embodiment, the thermistor is formed by extension of at least one dummy trench 2112 until the first electrode 11 (the gate line). Thus the Emitter/Collector potential reaches and touches a line of the Gate potential. In various embodiments, the line pattern may also be modified to facilitate the connection to the extended trench.

As it can be seen on FIG. 12, the polysilicon filling 121 in a dummy trench 2112 and the polysilicon layer 161 of the first electrode part are usually separated on from the other. In addition, each one is surrounded by an isolating film 123 (oxide layer), respectively 163, in order to electrically isolate them from the environment. By comparison, as it can be seen on FIG. 13 of the third embodiment, an extension part of polysilicon material is provided between the polysilicon filling 121 of the dummy trench 2112 and the polysilicon layer 161 of the first electrode part. In the third embodiment, the said extension part forms the monitoring portion 13.

The extension part forming the monitoring portion 13 is made in one-piece with the first electrode 11 (the polysilicon layer 161 and the polysilicon filling 131). The extension part is in electrical contact with the second electrode 12, via the plug 144 and the metal layer 109. In an operational state of the module 1, a leakage current flows between the first electrode 11 and the second electrode 12.

Three main embodiments had been described. A person skilled in the art would understand that these three embodiments are examples and have not to be interpreted as limitations of the scope of the invention. Most features described with respect to one embodiment can be transposed/adapted to another embodiment. For example, features about how to set the thermistance behavior are explained with respect to the first embodiment. Such features can be adapted to the other embodiments. A person skilled in the art would know how to set up the thermistance behavior, for example by adapting the location, the form and the size of the monitoring portion 13 in function of each embodiment of a module 1. The useful cross-section to adapt in order to set-up the thermistance can correspond to the height and the width of the gap in the first embodiment, to the width and the thickness of the polysilicon layer 120 in the second embodiment and to the width and the thickness of the extension part in the third embodiment.

Figure 14:
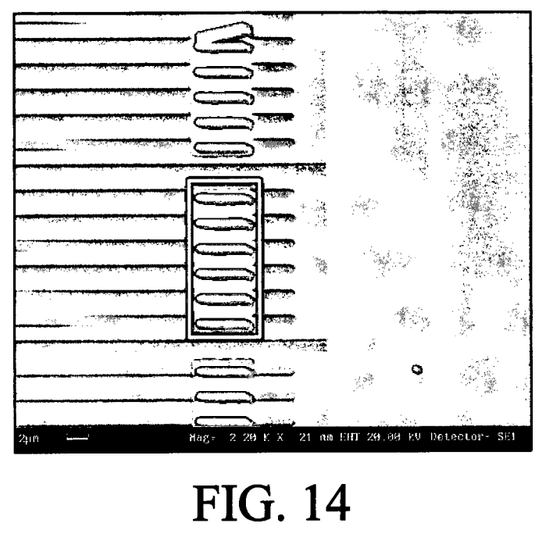
FIG. 14 is a photograph of a module according to the invention and substantially corresponding to the part shown on FIG. 7; the photograph is made by the company "SYSTEM PLUS CONSULTING", which is a partner of the applicants.
Figure 15:
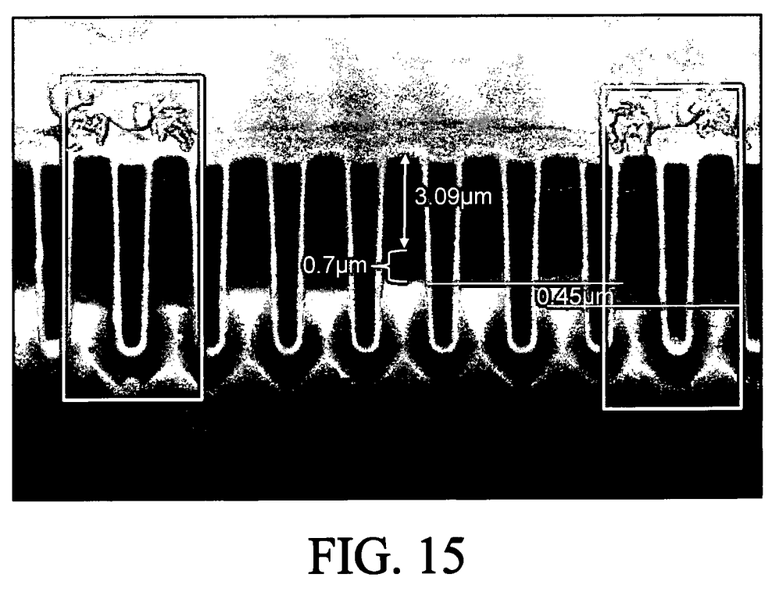
FIG. 15 is a photograph of a module according to the invention and substantially corresponding to the part shown on FIG. 9; the photograph is made by the company "SYSTEM PLUS CONSULTING", which is a partner of the applicants.

FIG. 14 and FIG. 15 are photographs of modules 1 on which dimension scales are represented as examples.

The modules 1 above described, and especially the measurement circuitry 2 (see FIG. 3) can be used to enforce, during the operational life of the module 1, two methods: a measurement method for estimating a temperature of the module 1 and a measurement method for estimating a state of health of a connection of the module 1, especially the second electrode connection 18.

The measurement method for estimating a temperature of the module 1 comprises, for example:
a) trigger a measurement when no current is provided from the Emitter E of the IGBT, respectively from the Source S of the MOSFET;
b) generate a diagnostic mode of the first electrode 11 (the Gate) of the module 1 during which the resistance 17 is positioned in a current loop first electrode 11-second electrode 12-voltage source;
c) monitor at least a voltage $V_{meas}$ or a current $I_{meas}$ on said loop;
d) convert the monitored values into temperatures according to calibration data.

The step a), the measurement triggering, is performed when the emitter connection of the IGBT is not crossed by a current. Thus, any temperature and current dependent voltage drop in the emitter connection does not interact with the measure. This situation is possible, for example, when the current is OFF. In the case where the anti-parallel diode is sharing the emitter connection (see FIG. 3), the diode should be off too. These conditions are either detected using a current sensor and/or controller information. In an alternative embodiment, the voltage drop in the emitter connection is not strictly zero but considered small, for example less than 200 mV. In such a case, the voltage drop can be neglected or compensated for.

The step d, conversion based on calibration data, implies that the module 1 is pre-characterized. For example, the characterization comprises generating a thermistance profile of the module 1, for example in the form of a function "f" having the temperature (T) as a parameter, like $R_{ge}$=f(T) or $V_{meas}$=f(T) or $I_{meas}$f(T).

The measurement method for estimating a state of health of a connection of the module 1 comprises, for example:
1) trigger a measurement when a high current is crossing a connection (for example the second electrode connection 18) of the Emitter E of the IGBT, respectively from the Source S of the MOSFET;
2) generate a diagnostic mode of the first electrode 11 of the module 1 during which said first electrode 11 is electrically disconnected. This can be made, for example, by connecting the first electrode 11 to a resistor having a resistance value superior to ten times the resistance value R of the monitoring portion 13 (different from the resistor 17 of FIG. 3);
3) monitor at least a voltage $V_{meas}$;
4) convert the monitored values into a damage index according to calibration data.

The thermistance behavior may drift in time as an effect of material instability (mechanical, chemical). This phenomenon is accelerated with high temperature environment of the die.

In order to counter the effect of drift, re-calibration may be performed at regular interval. Such re-calibration is performed, for example, when the module 1 reaches a uniform temperature in the operation of off-state. Calibration is for example performed using another temperature sensor in the module 1, for example on a baseplate of the module 1. Since it is difficult to obtain the temperature characteristic drift in the wide temperature range, it is possible to use the drift value at a specific temperature and estimate the drift value for other temperature values by using a model. In some embodiments, the drift value at a specific temperature is used as a health indicator for the module 1.

For example, the drift at 25° C. is regularly monitored. When it is above a pre-defined threshold value, a warning message is generated.

The methods described here can be implemented in the form of a computer program, for example enforced by a chip or to be implemented by a processor. The invention is not limited to the modules, masks, methods, computer programs and computer-readable non-transient recording medium described here, which are only examples. The invention encompasses every alternative that a person skilled in the art would envisage when reading this text.

REFERENCE SIGNS LIST

1: module
2: measurement circuitry
3: sensor part
11: first electrode
12: second electrode
13: monitoring portion
17: resistance
18: second electrode connection
21: trench
23: electrical insulator
100: superposition
101: finish layer
102: first P doped layer
103: $N^+$ doped layer
104: first $N^-$ doped layer
105: second $N^-$ doped layer
106: second P doped layer
107: oxide layer
108: BPSG layer
109: metal layer
120: polysilicon layer
121: polysilicon filling
123: isolating film
130: portion of the oxide layer
131: polysilicon filling
133: isolating film
141: top portion of a plug
143: top portion of a plug
144: plugs
151: bottom portion of a plug
153: bottom portion of a plug
161: polysilicon layer
163: isolating film
167: plugs
170: protective layer
2111: first electrode trench
2112: dummy trench

The invention claimed is:
1. Power semi-conductor module comprising:
at least one Insulated Gate Bipolar Transistor IGBT with a Gate G forming a first electrode and an Emitter E forming a second electrode, or
at least one Metal-Oxide-Semiconductor Field-Effect Transistor MOSFET with a Gate G forming a first electrode and a Source S forming a second electrode;
said first electrode including a polysilicon material made in one piece,
said one-piece being made partly of a monitoring portion,
said monitoring portion including said polysilicon material and being in electrical contact with the second electrode such that a leakage current flows between the first electrode and the second electrode in an operational state of the module;

said monitoring portion having a location, a form, a size and a material composition selected together such that to have a variable resistance in function of its temperature during said operational state of said module, characterized in that the monitoring portion comprises at least one of the following:

a polysilicon layer covering continuously at least a trench of the first electrode and a dummy trench of the second electrode;

an extension part of the second electrode disposed between a polysilicon material element of the first electrode and a polysilicon material element of the second electrode in such a way to ensure an electric link between said two electrodes.

2. Module according to claim 1, wherein said monitoring portion have a material composition and a useful cross-section selected together such that:

a resistance value of the monitoring portion has a value between 10 kΩ and 1 MΩ for the expected operating temperatures range of the module; and/or a resistance value of the monitoring portion has a variation of at least a factor of 2% within the expected operating temperatures range of the module.

3. Module according to claim 1, wherein the monitoring portion comprises the following:

a passage arranged through an oxide layer lining a wall of a trench of the first electrode.

4. Module according to claim 1, further comprising a measurement circuitry electrically connected between the first electrode and the second electrode.

5. Module according to claim 4, wherein the measurement circuitry includes:

at least one Analog-to-Digital Converter;

a resistance having a resistance value Rm, Rm being equal to α×R, where R is the resistance of the monitoring portion and α is a factor comprised between 0.1 and 10; and a set of switches arranged such that to connect and disconnect the resistance from a closed electrical network including the first electrode, the second electrode, and a voltage source of a gate driver.

6. A mask for a polysilicon deposition operation during fabrication of a module according to claim 1, said mask being configured such that the polysilicon material forming the first electrode and the monitoring portion is deposited during a single deposition operation and in one piece.

7. A measurement method for estimating a temperature of a power semi-conductor module according to claim 1;

said method comprising:

a) trigger a measurement when no current is provided from the Emitter E of the Insulated Gate Bipolar Transistor IGBT, respectively from the Source S of the Metal-Oxide-Semiconductor Field-Effect Transistor MOSFET;

b) generate a diagnostic mode of the first electrode of the module during which a resistance is positioned in a closed electrical network including the first electrode, the second electrode, and a voltage source of a gate driver;

c) monitor at least a voltage or a current on said loop;

d) convert the monitored values into temperatures according to calibration data.

8. Computer software comprising instructions to implement the method according to claim 7 when the software is executed by a processor.

9. Computer-readable non-transient recording medium on which a software is registered to implement the method according to claim 7 when the software is executed by a processor.

10. A measurement method for estimating a state of health of a connection of a power semi-conductor module according to claim 1;

said method comprising:

1) trigger a measurement when a high current is crossing a connection of the Emitter E of the Insulated Gate Bipolar Transistor IGBT, respectively from the Source S of the Metal-Oxide-Semiconductor Field-Effect Transistor MOSFET;

2) generate a diagnostic mode of the first electrode of the module during which said first electrode is electrically disconnected;

3) monitor at least a voltage;

4) convert the monitored values into a damage index according to calibration data.

11. Computer software comprising instructions to implement the method according to claim 10 when the software is executed by a processor.

12. Computer-readable non-transient recording medium on which a software is registered to implement the method according to claim 10 when the software is executed by a processor.

* * * * *